United States Patent
Balakrishnan

(10) Patent No.: US 9,576,637 B1
(45) Date of Patent: Feb. 21, 2017

(54) FINE GRANULARITY REFRESH

(71) Applicant: Advanced Micro Devices, Inc., Sunnyvale, CA (US)

(72) Inventor: Kedarnath Balakrishnan, Austin, TX (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 0 days.

(21) Appl. No.: 15/164,721

(22) Filed: May 25, 2016

(51) Int. Cl.
G11C 7/00 (2006.01)
G11C 11/00 (2006.01)
G11C 11/406 (2006.01)
G06F 3/06 (2006.01)

(52) U.S. Cl.
CPC ......... *G11C 11/40615* (2013.01); *G06F 3/061* (2013.01); *G06F 3/0625* (2013.01); *G06F 3/0634* (2013.01); *G06F 3/0653* (2013.01); *G06F 3/0673* (2013.01)

(58) Field of Classification Search
CPC .... G11C 11/41; G11C 11/401; G11C 11/4091; G11C 16/3431; G11C 13/0033; G11C 2211/406
See application file for complete search history.

(56) References Cited

U.S. PATENT DOCUMENTS

| 6,496,906 | B1 | 12/2002 | Novak et al. | |
| 2014/0133255 | A1* | 5/2014 | Kajigaya | G11C 11/406 365/222 |
| 2015/0162071 | A1* | 6/2015 | Yoon | G11C 11/4085 365/203 |
| 2016/0180917 | A1* | 6/2016 | Chishti | G11C 11/40611 365/203 |

OTHER PUBLICATIONS

"DDR4 SDRAM", JEDEC Standard JESD79-4, Sep. 2012, JEDEC Solid State Technology Association, 5 pages.

\* cited by examiner

*Primary Examiner* — Hien Nguyen
(74) *Attorney, Agent, or Firm* — Polansky & Associates, P.L.L.C.; Paul J. Polansky; Rosalynn M. Smith

(57) ABSTRACT

A data processing system includes a memory channel and a data processor coupled to the memory channel. The data processor is adapted to access at least one rank and has refresh logic. In response to an activation of the refresh logic, the data processor generates refresh cycles to a bank of the memory channel. The data processor selects one of a first state corresponding to a first auto-refresh command that causes the data processor to auto-refresh the bank, and a second state corresponding to a second auto-refresh command that causes the data processor to auto-refresh a selected subset of the bank. The data processor initiates a switch between the first state and the second state in response to the refresh logic detecting a first condition related to the bank, and between the second state and the first state in response to the refresh logic circuit detecting a second condition.

31 Claims, 7 Drawing Sheets

US 9,576,637 B1

FINE GRANULARITY REFRESH

FIELD OF DISCLOSURE

The present disclosure relates generally to data processing systems, and more particularly to refreshing memory systems in data processing systems.

BACKGROUND

A variety of techniques have been developed to increase the overall processing speed of computer systems. Vast improvements in integrated circuit processing technologies have contributed to the ability to increase computer processing speeds and memory capacity, thereby contributing to the overall improved performance of computer systems. The ability to produce integrated circuits with sub-micron features enables the amount of electrical components, such as capacitors, per integrated circuit to also increase.

Dynamic random access memory (DRAM) chips, comprised of large arrays of capacitors with sub-micron features, are utilized for main memory in computer systems. DRAM is typically inexpensive and high density, thereby enabling large amounts of DRAM to be integrated per device. Due to the inherit nature of capacitors, DRAM must continuously be refreshed or the data stored within the capacitor will be lost. Each capacitor slowly leaks charge, and if the DRAM is not refreshed, eventually the capacitors will leak enough charge and encounter irreversible data corruption.

Most DRAM chips sold today are compatible with various double data rate (DDR) DRAM standards promulgated by the Joint Electron Devices Engineering Council (JEDEC). The standards provided by JEDEC provide a refresh cycle time that prevents the access of data for a period of time. Increasing DDR DRAM device density within a computer system increases the amount of time required for refresh, and thereby increases computer processing latency.

In order to address these issues, JEDEC adopted a feature in the DDR version four (DDR4) standard known as 1×, 2×, and 4× refresh mode. In these modes, a DDR4 memory can refresh a selected bank, one half of the selected bank, or one fourth of the selected bank, respectively, in response to a single refresh (REF) command. A mode register, mode register 3 (MR3), is used to select between these modes. Moreover, MR3 can also be programmed to support "on-the-fly" modes in which the choice of 1× or 2×, or the choice of 1× or 4×, can be performed dynamically and indicated by an unused address bit.

Figure 1:
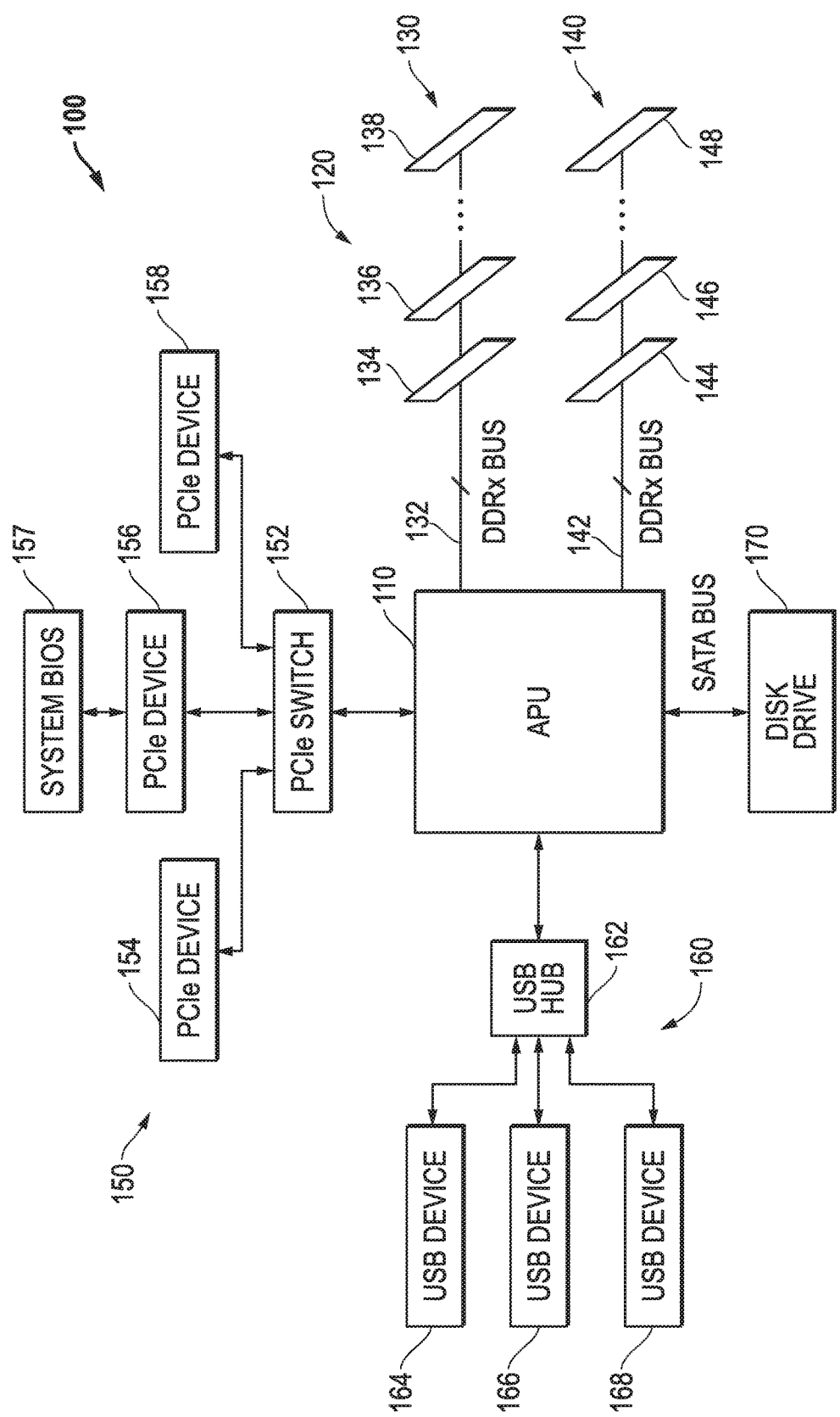
FIG. 1 illustrates in block diagram form a data processing system according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below in one form, a data processing system includes a memory channel having at least one rank, and a data processor coupled to the memory channel having refresh logic. In response to an activation of the refresh logic, the data processor generates refresh cycles to a bank of the memory channel. The data processor selects one of a first state and a second state, wherein the first state corresponds to a first auto-refresh command that causes the data processor to auto-refresh the bank, and the second state corresponds to a second auto-refresh command that causes the data processor to auto-refresh a selected subset of the bank. The data processor initiates a switch between the first state and the second state in response to the refresh logic detecting a first condition related to the bank, and initiates a switch between the second state and the first state in response to the refresh logic circuit detecting a second condition.

In another form, a data processor includes a memory accessing agent and a memory controller coupled to the memory accessing agent and adapted to couple to a memory system. The memory controller includes a refresh logic circuit for generating refresh cycles to a memory of the memory system. The memory controller has an on-the-fly mode that includes a first state and a second state. The first state corresponds to a first auto-refresh command (e.g. REF1) that causes the memory to auto-refresh a bank. The second state corresponds to a second auto-refresh command (e.g. REF2 or REF4) that causes the memory to auto-refresh a selected subset of the bank. The memory controller switches between the first state and the second state in response to the refresh logic circuit detecting a first condition related to the bank. The memory controller switches between the second state and the first state in response to the refresh logic circuit detecting a second condition.

In yet another form, there is described a method for managing refresh of a memory in a memory system via a memory controller. A first auto-refresh command is generated when the memory controller is in a first state, wherein the first auto-refresh command causes the memory controller to auto-refresh a bank. A second auto-refresh command is generated when the memory controller is in a second state, wherein the second auto-refresh command causes the memory to auto-refresh a selected subset of the bank. In response to the memory controller detecting a first condition a switch between the first state and the second state is made. In response to the memory controller detecting a second condition, a switch between the second state and the first state is made.

FIG. 1 illustrates in block diagram form a data processing system 100 according to some embodiments. Data processing system 100 includes generally a data processor 110 in the form of an accelerated processing unit (APU), a memory system 120, a peripheral component interconnect express (PCIe) system 150, a universal serial bus (USB) system 160, and a disk drive 170. Data processor 110 operates as the central processing unit (CPU) of data processing system 100 and provides various buses and interfaces useful in modern computer systems. These interfaces include two double data rate (DDRx) memory channels, a PCIe root complex for connection to a PCIe link, a USB controller for connection to a USB network, and an interface to a Serial Advanced Technology Attachment (SATA) mass storage device.

Memory system 120 includes a memory channel 130 and a memory channel 140. Memory channel 130 includes a set of dual inline memory modules (DIMMs) connected to a DDRx bus 132, including representative DIMMs 134, 136, and 138 that in this example correspond to separate ranks. Likewise memory channel 140 includes a set of DIMMs connected to a DDRx bus 142, including representative DIMMs 144, 146, and 148.

PCIe system 150 includes a PCIe switch 152 connected to the PCIe root complex in data processor 110, a PCIe device 154, a PCIe device 156, and a PCIe device 158. PCIe device 156 in turn is connected to a system basic input/output system (BIOS) memory 157. System BIOS memory 157 can be any of a variety of non-volatile memory types, such as read-only memory (ROM), flash electrically erasable programmable ROM (EEPROM), and the like.

USB system 160 includes a USB hub 162 connected to a USB master in data processor 110, and representative USB devices 164, 166, and 168 each connected to USB hub 162. USB devices 164, 166, and 168 could be devices such as a keyboard, a mouse, a flash EEPROM port, and the like.

Disk drive 170 is connected to data processor 110 over a SATA bus and provides mass storage for the operating system, application programs, application files, and the like.

Data processing system 100 is suitable for use in modern computing applications by providing a memory channel 130 and a memory channel 140. Each of memory channels 130 and 140 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Figure 2:
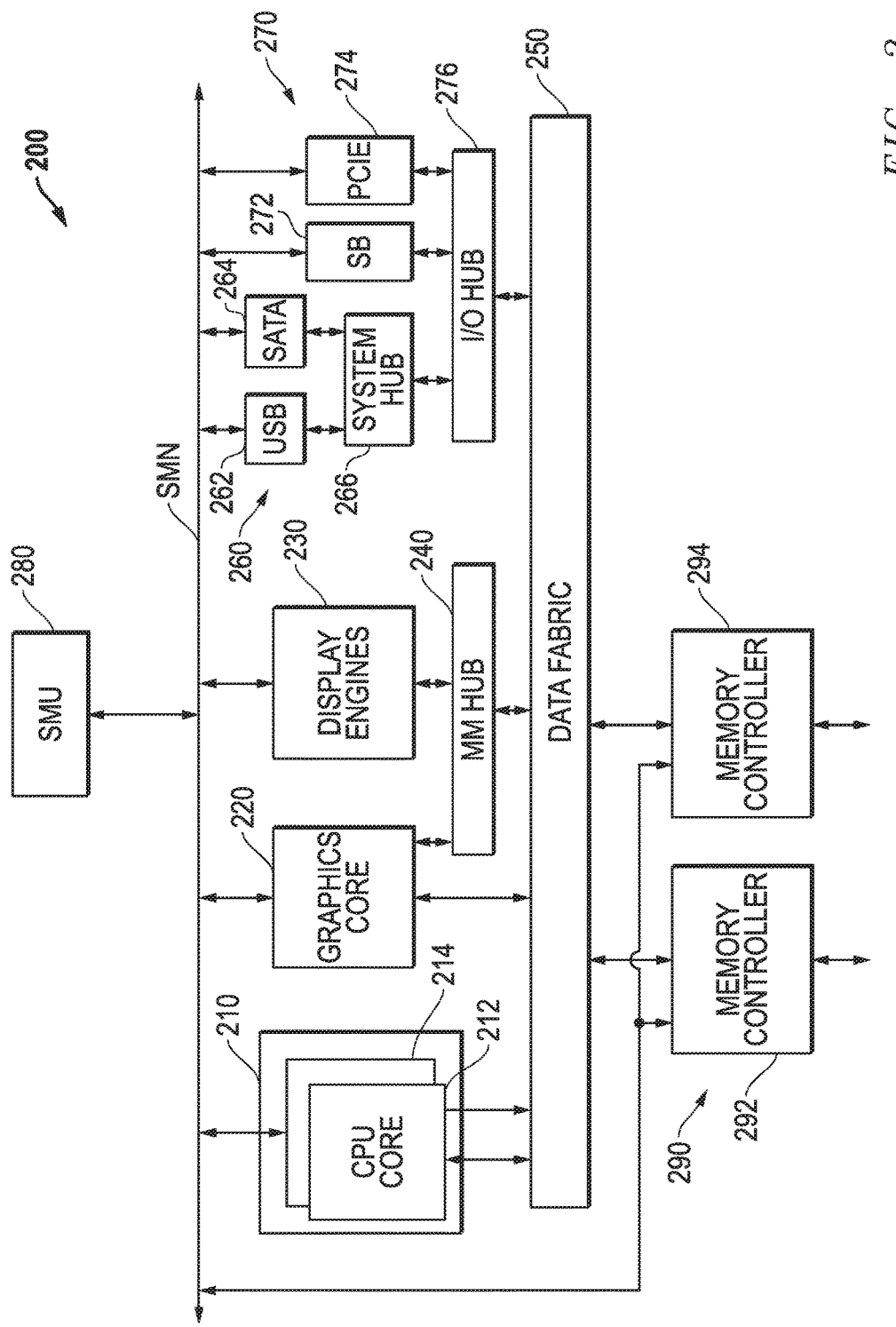
FIG. 2 illustrates in block diagram form an accelerated processing unit (APU) suitable for use in the data processing system of FIG. 1.

FIG. 2 illustrates in block diagram form an APU 200 suitable for use in data processing system 100 of FIG. 1. APU 200 includes generally a central processing unit (CPU) core complex 210, a graphics core 220, a set of display engines 230, a memory management hub 240, a data fabric 250, a set of peripheral controllers 260, a set of peripheral bus controllers 270, a system management unit (SMU) 280, and a set of memory controllers 290.

CPU core complex 210 includes a CPU core 212 and a CPU core 214. In this example, CPU core complex 210 includes two CPU cores, but in other embodiments CPU core complex can include an arbitrary number of CPU cores. Each of CPU cores 212 and 214 is bidirectionally connected to a system management network (SMN), which forms a control fabric, and to data fabric 250, and is capable of providing memory access requests to data fabric 250. Each of CPU cores 212 and 214 may be unitary cores, or may further be a core complex with two or more unitary cores sharing certain resources such as caches.

Graphics core 220 is a high performance graphics processing unit (GPU) capable of performing graphics operations such as vertex processing, fragment processing, shading, texture blending, and the like in a highly integrated and parallel fashion. Graphics core 220 is bidirectionally connected to the SMN and to data fabric 250, and is capable of providing memory access requests to data fabric 250. In this regard, APU 200 may either support a unified memory architecture in which CPU core complex 210 and graphics core 220 share the same memory space, or a memory architecture in which CPU core complex 210 and graphics core 220 share a portion of the memory space, while graphics core 220 also uses a private graphics memory not accessible by CPU core complex 210.

Display engines 230 render and rasterize objects generated by graphics core 220 for display on a monitor. Graphics core 220 and display engines 230 are bidirectionally connected to a common memory management hub 240 for uniform translation into appropriate addresses in memory system 120, and memory management hub 240 is bidirectionally connected to data fabric 250 for generating such memory accesses and receiving read data returned from the memory system.

Data fabric 250 includes a crossbar switch for routing memory access requests and memory responses between any memory accessing agent and memory controllers 290. It also includes a system memory map, defined by BIOS, for determining destinations of memory accesses based on the system configuration, as well as buffers for each virtual connection.

Peripheral controllers 260 include a USB controller 262 and a SATA interface controller 264, each of which is bidirectionally connected to a system hub 266 and to the SMN bus. These two controllers are merely exemplary of peripheral controllers that may be used in APU 200.

Peripheral bus controllers 270 include a system controller or "Southbridge" (SB) 272 and a PCIe controller 274, each of which is bidirectionally connected to an input/output (I/O) hub 276 and to the SMN bus. I/O hub 276 is also bidirectionally connected to system hub 266 and to data fabric 250. Thus for example a CPU core can program registers in USB controller 262, SATA interface controller 264, SB 272, or PCIe controller 274 through accesses that data fabric 250 routes through I/O hub 276.

SMU 280 is a local controller that controls the operation of the resources on APU 200 and synchronizes communication among them. SMU 280 manages power-up sequencing of the various processors on APU 200 and controls multiple off-chip devices via reset, enable and other signals. SMU 280 includes one or more clock sources not shown in FIG. 2, such as a phase locked loop (PLL), to provide clock signals for each of the components of APU 200. SMU 280 also manages power for the various processors and other functional blocks, and may receive measured power consumption values from CPU cores 212 and 214 and graphics core 220 to determine appropriate power states.

APU 200 also implements various system monitoring and power saving functions. In particular one system monitoring function is thermal monitoring. For example, if APU 200 becomes hot, then SMU 280 can reduce the frequency and voltage of CPU cores 212 and 214 and/or graphics core 220. If APU 200 becomes too hot, then it can be shut down entirely. Thermal events can also be received from external sensors by SMU 280 via the SMN bus, and SMU 280 can reduce the clock frequency and/or power supply voltage in response.

Figure 3:
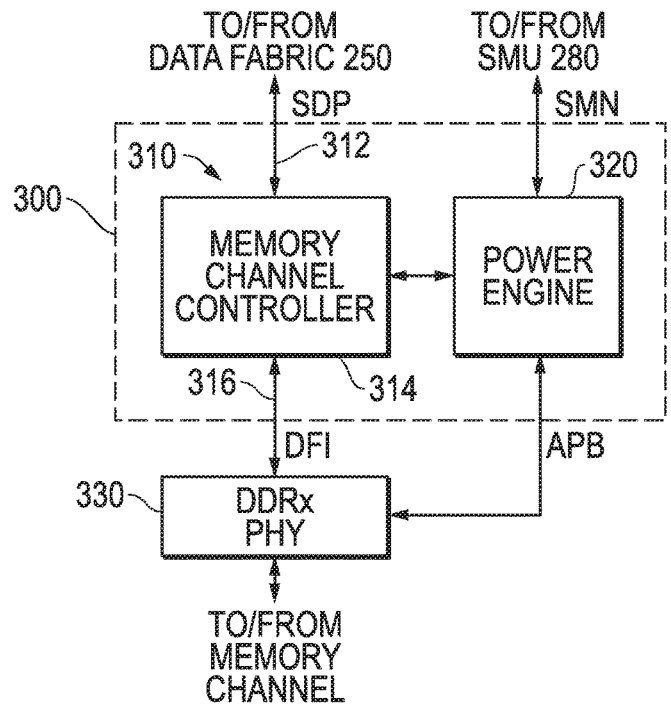
FIG. 3 illustrates in block diagram form a memory controller and associated physical interface (PHY) suitable for use in the APU of FIG. 2 according to some embodiments.

FIG. 3 illustrates in block diagram form a memory controller 300 and an associated physical interface (PHY) 330 suitable for use in APU 200 of FIG. 2 according to some embodiments. Memory controller 300 includes a memory channel 310 and a power engine 320. Memory channel 310 includes a host interface 312, a memory channel controller 314, and a physical interface 316. Host interface 312 bidirectionally connects memory channel controller 314 to data fabric 250 over a scalable data port (SDP). Physical interface 316 bidirectionally connects memory channel controller 314 to PHY 330 over a bus that conforms to the DDR-PHY Interface Specification (DFI). Power engine 320 is bidirectionally connected to SMU 280 over the SMN bus, to PHY 330 over the Advanced Peripheral Bus (APB), and is also bidirectionally connected to memory channel controller 314. PHY 330 has a bidirectional connection to a memory channel such as memory channel 130 or memory channel 140 of FIG. 1. Memory controller 300 is an instantiation of a memory controller for a single memory channel using a single memory channel controller 314, and has a power engine 320 to control operation of memory channel controller 314 in a manner that will be described further below.

Figure 4:
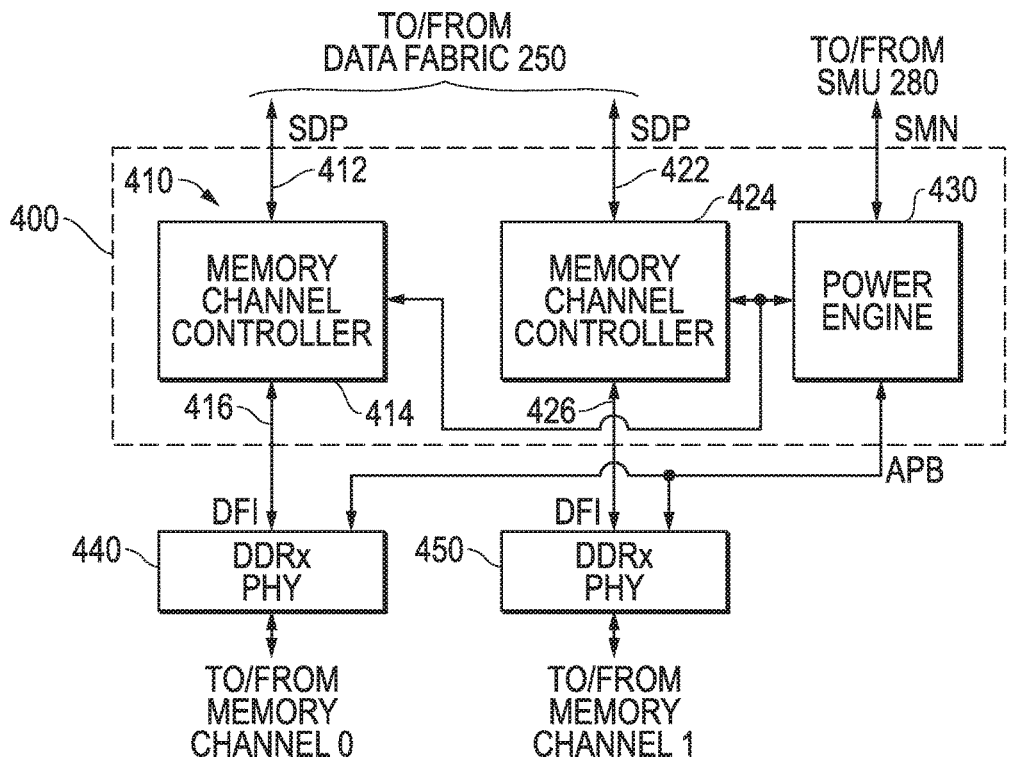
FIG. 4 illustrates in block diagram form another memory controller and associated PHY suitable for use in the APU of FIG. 2 according to some embodiments.

FIG. 4 illustrates in block diagram form another memory controller 400 and associated PHYs 440 and 450 suitable for use in APU 200 of FIG. 2 according to some embodiments. Memory controller 400 includes memory channels 410 and 420 and a power engine 430. Memory channel 410 includes a host interface 412, a memory channel controller 414, and a physical interface 416. Host interface 412 bidirectionally connects memory channel controller 414 to data fabric 250 over an SDP. Physical interface 416 bidirectionally connects memory channel controller 414 to PHY 440, and conforms to the DFI Specification. Memory channel 420 includes a host interface 422, a memory channel controller 424, and a physical interface 426. Host interface 422 bidirectionally connects memory channel controller 424 to data fabric 250 over another SDP. Physical interface 426 bidirectionally connects memory channel controller 424 to PHY 450, and conforms to the DFI Specification. Power engine 430 is bidirectionally connected to SMU 280 over the SMN bus, to PHYs 440 and 450 over the APB, and is also bidirectionally connected to memory channel controllers 414 and 424. PHY 440 has a bidirectional connection to a memory channel such as memory channel 130 of FIG. 1. PHY 450 has a bidirectional connection to a memory channel such as memory channel 140 of FIG. 1. Memory controller 400 is an instantiation of a memory controller having two memory channel controllers and uses a shared power engine 430 to control operation of both memory channel controller 414 and memory channel controller 424 in a manner that will be described further below.

Figure 5:
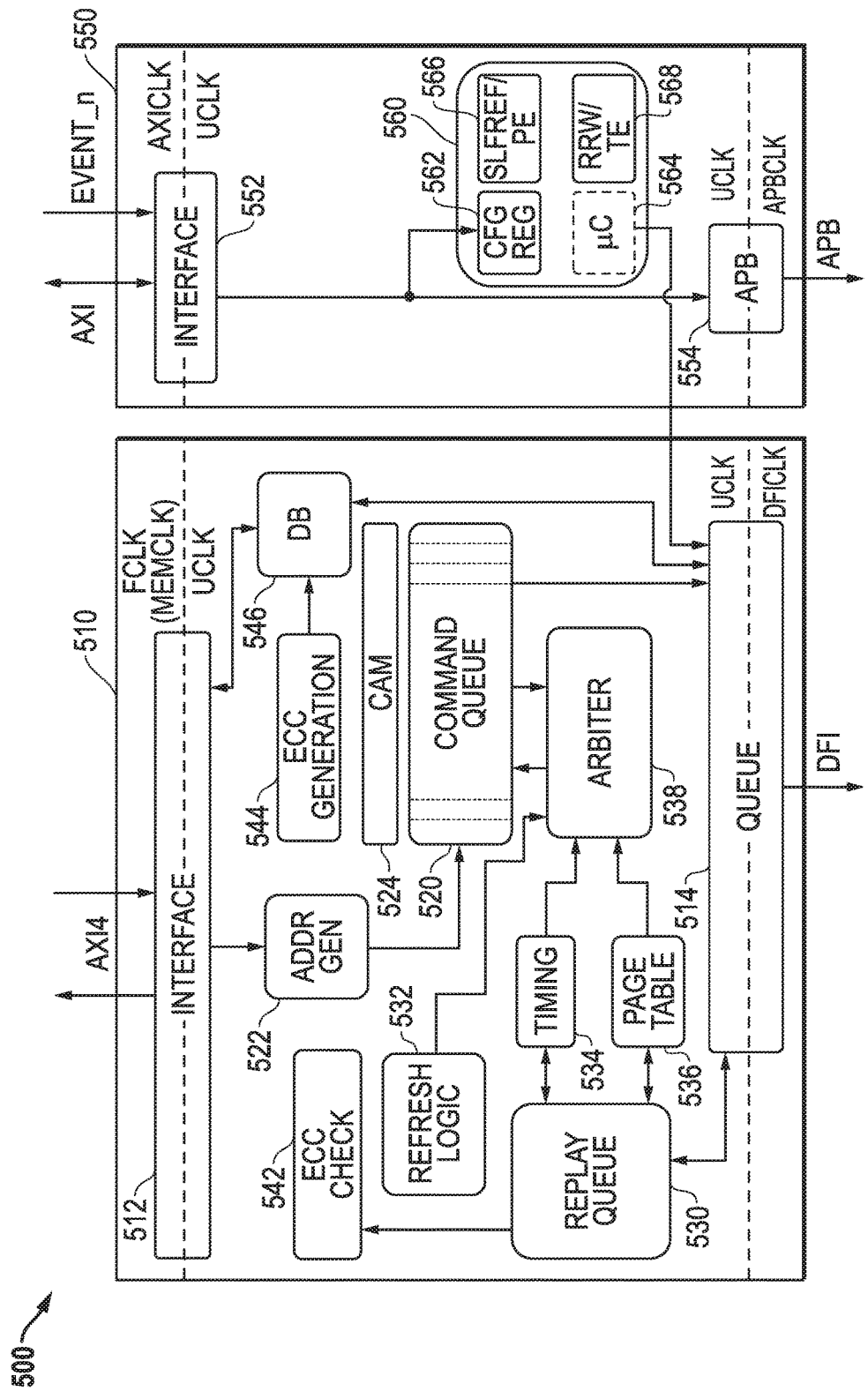
FIG. 5 illustrates in block diagram form a memory controller according to some embodiments.

FIG. 5 illustrates in block diagram form a memory controller 500 according to some embodiments. Memory controller 500 includes generally a memory channel controller 510 and a power controller 550. Memory channel controller 510 includes generally an interface 512, a queue 514, a command queue 520, an address generator 522, a content addressable memory (CAM) 524, a replay queue 530, a refresh logic block 532, a timing block 534, a page table 536, an arbiter 538, an error correction code (ECC) check block 542, an ECC generation block 544, and a data buffer (DB) 546.

Interface 512 has a first bidirectional connection to data fabric 250 over an external bus, and has an output. In memory controller 500, this external bus is compatible with the advanced extensible interface version four specified by ARM Holdings, PLC of Cambridge, England, known as "AXI4", but can be other types of interfaces in other embodiments. Interface 512 translates memory access requests from a first clock domain known as the FCLK (or MEMCLK) domain to a second clock domain internal to memory controller 500 known as the UCLK domain. Similarly, queue 514 provides memory accesses from the UCLK domain to the DFICLK domain associated with the DFI interface.

Address generator 522 decodes addresses of memory access requests received from data fabric 250 over the AXI4 bus. The memory access requests include access addresses in the physical address space represented in a normalized format. Address generator 522 converts the normalized addresses into a format that can be used to address the actual memory devices in memory system 120, as well as to efficiently schedule related accesses. This format includes a region identifier that associates the memory access request with a particular rank, a row address, a column address, a bank address, and a bank group. On startup, the system BIOS queries the memory devices in memory system 120 to determine their size and configuration, and programs a set of configuration registers associated with address generator 522. Address generator 522 uses the configuration stored in the configuration registers to translate the normalized addresses into the appropriate format. Command queue 520 is a queue of memory access requests received from the memory accessing agents in data processing system 100, such as CPU cores 212 and 214 and graphics core 220. Command queue 520 stores the address fields decoded by address generator 522 as well other address information that allows arbiter 538 to select memory accesses efficiently, including access type and quality of service (QoS) identifiers. CAM 524 includes information to enforce ordering rules, such as write after write (WAW) and read after write (RAW) ordering rules.

Replay queue 530 is a temporary queue for storing memory accesses picked by arbiter 538 that are awaiting responses, such as address and command parity responses, write cyclic redundancy check (CRC) responses for DDR4 DRAM or write and read CRC responses for gDDR5 DRAM. Replay queue 530 accesses ECC check block 542 to determine whether the returned ECC is correct or indicates an error. Replay queue 530 allows the accesses to be replayed in the case of a parity or CRC error of one of these cycles.

Refresh logic 532 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh logic 532 generates refresh commands periodically to prevent data errors caused by leaking of charge off storage capacitors of memory cells in DRAM chips. In addition, refresh logic 532 periodically calibrates ZQ to prevent mismatch in on-die termination resistance due to thermal changes in the system.

Arbiter 538 is bidirectionally connected to command queue 520 and is the heart of memory channel controller 510. It improves efficiency by intelligent scheduling of accesses to improve the usage of the memory bus. Arbiter 538 uses timing block 534 to enforce proper timing relationships by determining whether certain accesses in command queue 520 are eligible for issuance based on DRAM timing parameters. For example, each DRAM has a minimum specified time between activate commands, known as "$t_{RC}$". Timing block 534 maintains a set of counters that determine eligibility based on this and other timing parameters specified in the JEDEC specification, and is bidirectionally connected to replay queue 530. Page table 536 maintains state information about active pages in each bank and rank of the memory channel for arbiter 538, and is bidirectionally connected to replay queue 530.

In response to write memory access requests received from interface 512, ECC generation block 544 computes an ECC according to the write data. DB 546 stores the write data and ECC for received memory access requests. It outputs the combined write data/ECC to queue 514 when arbiter 538 picks the corresponding write access for dispatch to the memory channel.

Power controller 550 generally includes an interface 552 to an advanced extensible interface, version one (AXI), an APB interface 554, and a power engine 560. Interface 552 has a first bidirectional connection to the SMN, which includes an input for receiving an event signal labeled "EVENT_n" shown separately in FIG. 5, and an output. APB interface 554 has an input connected to the output of interface 552, and an output for connection to a PHY over an APB. Power engine 560 has an input connected to the output of interface 552, and an output connected to an input of queue 514. Power engine 560 includes a set of configuration registers 562, a microcontroller (μC) 564, a self refresh controller (SLFREF/PE) 566, and a reliable read/write timing engine (RRW/TE) 568. Configuration registers 562 are programmed over the AXI bus, and store configuration information to control the operation of various blocks in memory controller 500. Accordingly, configuration registers 562 have outputs connected to these blocks that are not shown in detail in FIG. 5. Self refresh controller 566 is an engine that allows the manual generation of refreshes in addition to the automatic generation of refreshes by refresh logic 532. Reliable read/write timing engine 568 provides a continuous memory access stream to memory or I/O devices for such purposes as DDR interface maximum read latency (MRL) training and loopback testing.

Memory channel controller 510 includes circuitry that allows it to pick memory accesses for dispatch to the associated memory channel. In order to make the desired arbitration decisions, address generator 522 decodes the address information into predecoded information including rank, row address, column address, bank address, and bank group in the memory system, and command queue 520 stores the predecoded information. Configuration registers 562 store configuration information to determine how address generator 522 decodes the received address information. Arbiter 538 uses the decoded address information, timing eligibility information indicated by timing block 534, and active page information indicated by page table 536 to efficiently schedule memory accesses while observing other criteria such as QoS requirements. For example, arbiter 538 implements a preference for accesses to open pages to avoid the overhead of precharge and activation commands required to change memory pages, and hides overhead accesses to one bank by interleaving them with read and write accesses to another bank. In particular during normal operation, arbiter 538 normally keeps pages open in different banks until they are required to be precharged prior to selecting a different page.

Figure 6:
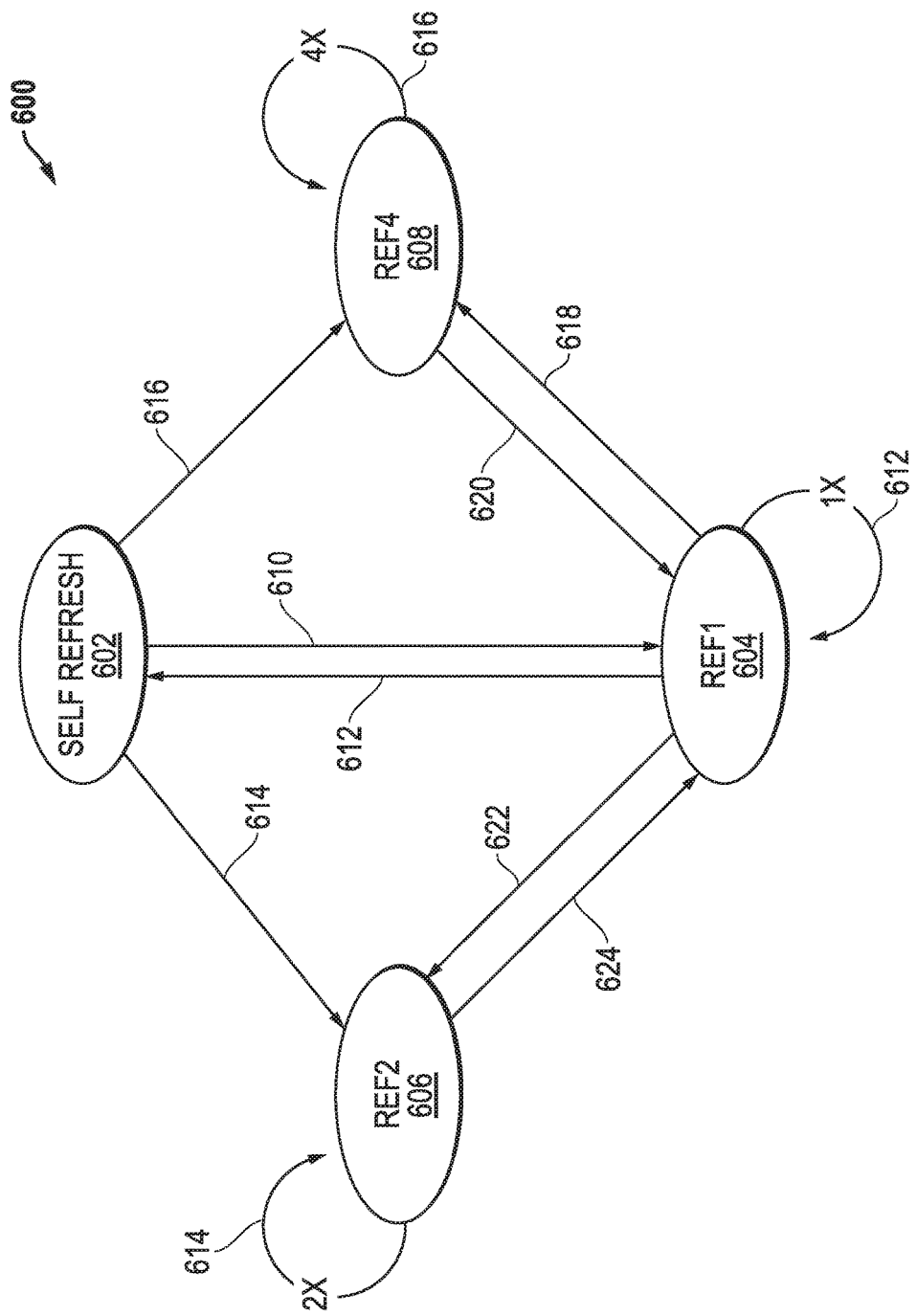
FIG. 6 illustrates in state diagram form refresh conditions according to some embodiments.

FIG. 6 illustrates state diagram 600 that may be used by memory controller 500 of FIG. 5 according to some embodiments. State diagram 600 is a diagram of states that correspond to a type of refresh command to be utilized by memory controller 500. State diagram 600 includes a self-refresh state 602, a refresh one state (REF1) 604, a refresh two state (REF2) 606, and a refresh four state (REF4) 608. State diagram 600 represents state transitions by arrows, and memory controller 500 performs the state transitions in response to corresponding conditions including conditions 610, 612, 614, 616, 618, 620, 622, and 624.

In operation, a memory controller such as memory controller 500 of FIG. 5 is connected to and receives memory access requests from a memory accessing agent, such as a CPU core in CPU core complex 210 or graphics core 220 of FIG. 2. Memory controller 500 is also adapted to connect to memory system 120 of FIG. 1. As described above, memory system 120 can include multiple ranks of memory implemented as DIMMs 134, 136, and 138 in FIG. 1. Memory controller 500 includes a refresh logic circuit such as refresh logic 532 of FIG. 5 for periodically generating refresh cycles to each bank or combination of banks in memory system 120. Refresh logic 532 implements an on-the-fly refresh mode in which it generates refresh commands with a granularity that it automatically selects in response to conditions associated with a memory bank to be refreshed.

Refresh logic 532 implements on-the-fly mode using a first state, REF1 state 604, and a second state, either REF2 state 606 or REF4 state 608. REF1 state 604 corresponds to the use of a first auto-refresh command, REF1, which causes the memory to auto-refresh a whole bank in response to a refresh (REF) command. REF2 state 606 corresponds to the use of a second auto-refresh command, REF2, which causes the memory to auto-refresh a selected subset of the bank, in this example one-half of the bank, in response to the REF command. REF4 state 608 also corresponds to the use of a third auto-refresh command, REF4, which causes the memory to auto-refresh a smaller selected subset of the bank, in this case one-fourth of the bank, in response to the REF command. Memory controller 290 switches between REF1 state 604 and REF2 state 606 or REF4 state 608 in response to detecting a first condition (condition 618 or condition 622, respectively) related to a bank to be refreshed. Memory controller 290 switches from REF2 state 606 or REF4 state 608 to REF1 state 604 in response to detecting a second condition (condition 624 or condition 620, respectively).

In general, refresh logic 532 issues refresh commands at a rate sufficient to refresh each memory bank within a period of time indicated by the refresh interval parameter $t_{REF1}$. The number of refresh commands issued during each $t_{REF}$ period depends on the type of refresh commands issued in the current refresh state. Refresh logic 532 provides one REF1 command to the bank during each $t_{REF1}$ period if the bank is in REF1 state 604, two REF2 commands to the bank during each $t_{REF1}$ period if the bank is in REF2 state 606, or four REF4 commands to the bank during each $t_{REF1}$ period if the bank is in REF4 state 608.

Refresh logic 532 is in self refresh state 602 when the corresponding memory is in a low power state. When memory controller 500 causes the memory to exit the low power state, refresh logic 532 transitions from self refresh state 602 to a selected one of REF1 state 604, REF2 state 606, and REF4 state 608. Memory controller 290 remains in its current state as indicated state transitions 632, 634, and 636 for REF1 state 604, REF2 state 606, and REF4 state 608 until certain conditions are met.

Any of a number of conditions for switching between the refresh states can be used alone or in various combinations. In the illustrated embodiment, these conditions include the number of pending refreshes to a bank, the number of pending memory access requests in command queue 520 of FIG. 5 to the bank, the priority and/or type (read or write) of the pending memory access requests to the bank, and whether there is a refresh condition pending to the given bank wherein the number of pending refreshes are above a predetermined threshold. Moreover, while FIG. 6 shows the refresh state machine for a single bank in a given rank of memory, the refresh state machine can be extended to larger subsets of the memory system in various ways, such as for all banks in a given rank and for corresponding banks in multiple ranks.

To take one simple example, refresh logic 532 can switch between REF1 state 604 and the REF2 state 606 if a number of pending memory access requests for the bank is above a threshold amount. This condition indicates that lower latency and hence a finer granularity of refresh is preferred. On the other hand, if refresh logic 532 is in REF2 state 606 but determines that an even number of REF2 commands has been issued and there are no pending memory access requests to the bank, then it changes from REF2 state 606 back to REF1 state 604 to preserve efficiency. A precondition for refresh logic 532 making a state transition from REF2 state 606 or REF4 state 608 is that the number of refreshes issued corresponds to the portion of the bank that is being refreshed at one time. Accordingly refresh logic 532 is connected to arbiter 538 as shown in FIG. 5 to track these conditions.

Figure 7:
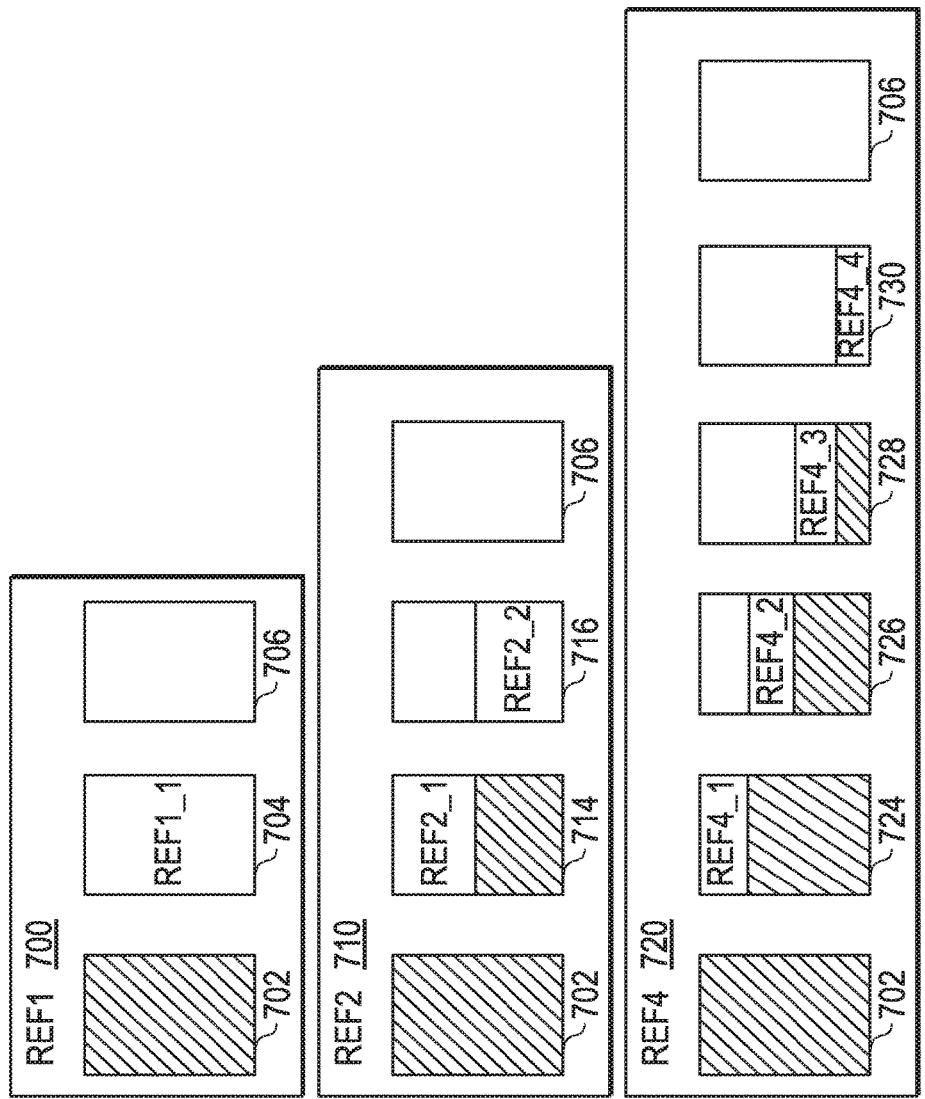
FIG. 7 illustrates in block diagram form refresh operations in different memory refresh states according to some embodiments.

FIG. 7 illustrates in block diagram form refresh operations in different memory refresh states. The memory refresh states of FIG. 7 include refresh one (REF1) state 700, refresh two (REF2) state 710, and refresh four (REF4) state 720. REF1 state 700 includes a bank 702 before refresh starts, a REF1_1 bank 704 during a REF1 command, and a refreshed bank 706. REF2 state 710 includes bank 702 before refresh starts, a REF2_1 bank 714 during a first REF2 command, a REF2_2 bank 716 during a second REF2 command, and refreshed bank 706. REF4 state 720 include bank 702 before refresh states, a REF4_1 bank 724 during a first REF4 command, a REF4_2 bank 726 during a second REF4 command, a REF4_3 bank 728 during a third REF4 command, a REF4_4 bank 730 during a fourth REF4 command, and refreshed bank 706.

REF1 state 700 corresponds to the use of a first auto-refresh command, REF1 command, that causes the memory to auto-refresh one or more banks 702. When REF1 command is executed, REF1 bank 704 is refreshed, resulting in refreshed bank 706.

REF2 state 710 corresponds to the use of a second auto-refresh command, REF2 command, that causes the memory to auto-refresh a first subset and a second subset of bank 702 within a period known as the refresh interval ($t_{REF1}$), as shown with REF2_1 bank 714 and REF2_2 bank 716. REF2_1 bank 714 and REF2_2 bank 716 are each a separate half subset of bank 702.

REF4 state 720 also corresponds to the use of a third auto-refresh command, REF4 command, that causes the memory to auto-refresh a first subset, a second subset, a third subset, and a fourth subset of bank 702 within a $t_{REF1}$ period. REF4_1 bank 724, REF4_2 bank 726, REF4_3 bank 728, and REF4_4 bank 730 correspond to the refreshed first subset, second subset, third subset, and fourth subset of bank 702. REF4_1 bank 724, REF4_2 bank 726, REF4_3 bank 728, and REF4_4 bank 730 are each separate quarter subsets of bank 702 within REF4 state 720.

The number of refreshes must correspond to a total number of subsets before a state change can occur. In one embodiment, a first auto-refresh command, REF1, is received causing the memory to auto-refresh a whole bank such as bank 702. In response to detecting a first condition a switch is made from REF1 700 to REF2 710 or to REF4 720. When a REF2 command is received, the total number of refreshes must be a multiple of two, before the condition is satisfied. When a REF4 command is received, the total number of refreshes must be a multiple of four, before the condition is satisfied.

By providing these different refresh modes with finer granularity than the REF1 mode, and using characteristics of pending memory access requests already tracked by memory controller 500 to make state change decisions on-the-fly, memory controller 500 is able to reduce the latency of incoming memory access requests during periods of high system bus usage, while refreshing memory banks more efficiently during periods of low system bus usage.

Figure 8:
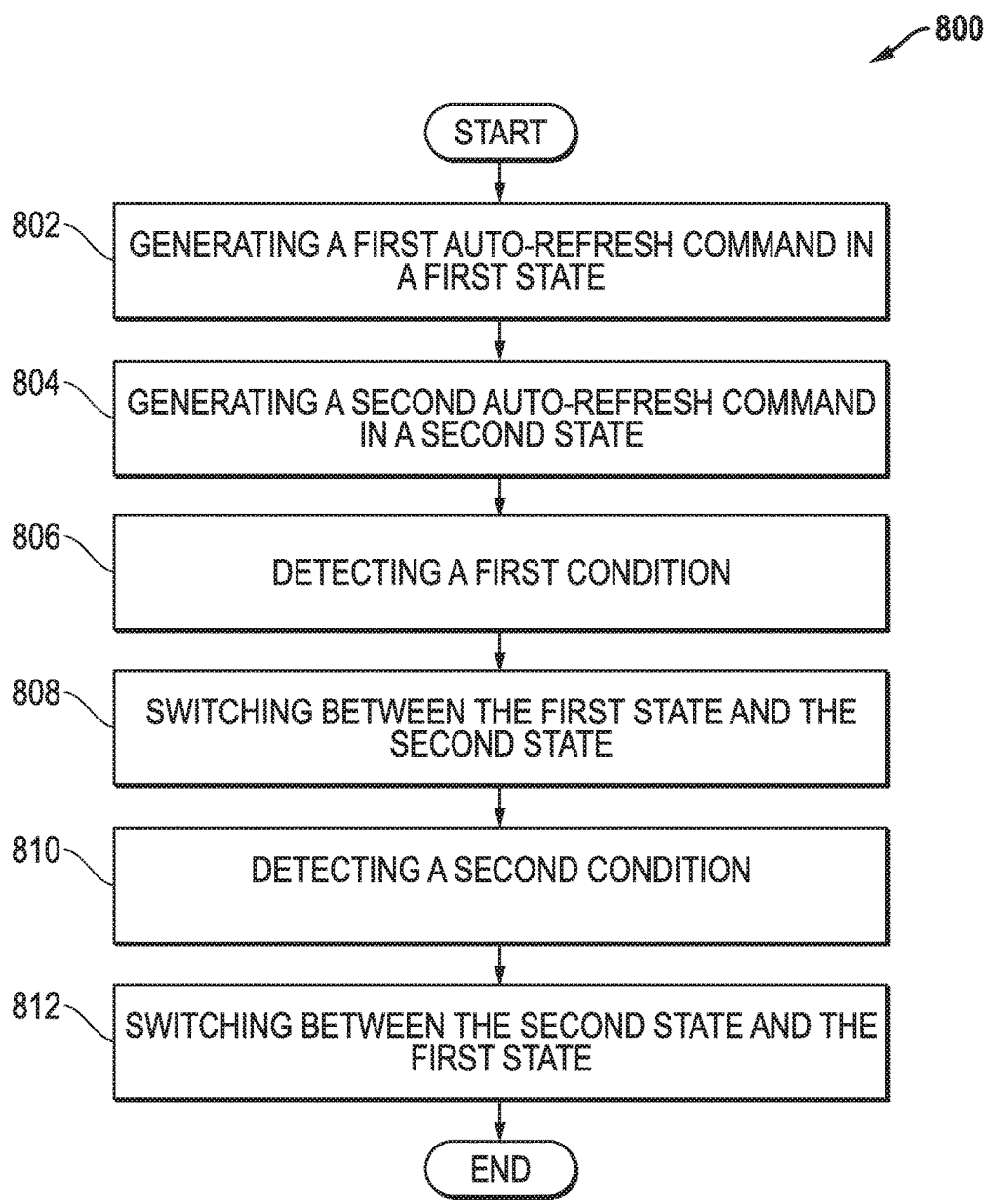
FIG. 8 illustrates a flow diagram that may be used by the memory controller of FIG. 5 according to some embodiments.

FIG. 8 illustrates a flow diagram of method 800 that may be used by memory controller 500 of FIG. 5. At block 802 a first auto-refresh command is generated in a first state. A second auto-refresh command is generated in a second state at block 804. At block 806 a first condition is detected. A switch between the first state and the second state is made at block 808. At block 810 a second condition is detected. In response to the second condition being detected, at block 810, a switch is made between the second state and the first state at block 812. The process concludes at the end block.

Some or all of the method illustrated in FIG. 8 may be governed by instructions that are stored in a computer readable storage medium and that are executed by at least one processor. Each of the operations shown in FIG. 8 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

While particular embodiments have been described, various modifications to these embodiments will be apparent to those skilled in the art. Memory controller 500 may interface to other types of memory besides DDRx memory, such as high bandwidth memory (HBM), RAMbus DRAM (RDRAM), and the like. While the illustrated embodiment showed each rank of memory corresponding to separate DIMMs, in other embodiments each DIMM can support multiple ranks. Moreover, the memory channel may comprise a plurality of ranks of double rate version four DDR4 memory.

Accordingly, it is intended by the appended claims to cover all modifications of the disclosed embodiments that fall within the scope of the disclosed embodiments.

What is claimed is:
1. A data processing system, comprising:
a memory channel comprising at least one rank; and
a data processor coupled to said memory channel and adapted to access said at least one rank said data processor having refresh logic, wherein in response to an activation of said refresh logic, said data processor:
generates refresh cycles to a bank of said memory channel, wherein said data processor selects one of a first state and a second state, wherein said first state corresponds to a first auto-refresh command that causes said data processor to auto-refresh said bank, and said second state corresponds to a second auto-refresh command that causes said data processor to auto-refresh a selected subset of said bank;

initiates a switch between said first state and said second state in response to said refresh logic detecting a first condition related to said bank; and initiates a switch between said second state and said first state in response to a detection of a second condition.

2. The data processing system of claim 1, wherein said refresh logic detects said first condition in response to a number of pending refreshes to said bank being above a predetermined threshold.

3. The data processing system of claim 1, wherein:

said refresh logic detects said second condition in response to a number of refreshes sent to said bank corresponds to a total number of subsets of said bank; and said data processor stores no access request to said bank.

4. The data processing system of claim 1, wherein:

said data processor refreshes a first subset and a second subset of said bank within a refresh cycle time when said second auto-refresh command is a refresh two (REF2) command; and each of said first subset and said second subset of said bank is a separate half subset of said bank.

5. The data processing system of claim 4, wherein:

said data processor refreshes said first subset, said second subset, a third subset, and a fourth subset of said bank within said refresh cycle time when said second auto-refresh command is a refresh four (REF4) command; and each of said first subset, said second subset, said third subset, and said fourth subset of said bank is a separate quarter subset of said bank.

6. The data processing system of claim 1, wherein said data processor detects said first condition in response to one or more of: a number of pending refreshes to said bank, a number of pending requests to said bank, a priority of said pending requests to said bank, and a type of said pending requests to said bank.

7. The data processing system of claim 6, wherein said data processor tracks said number of pending refreshes to said bank to determine an initiation of a switch between said first state and said second state.

8. The data processing system of claim 1, wherein said second auto-refresh command refreshes said selected subset of said bank of one rank.

9. The data processing system of claim 1, wherein said second auto-refresh command refreshes said selected subset of a plurality of banks of one rank.

10. The data processing system of claim 1, wherein said second auto-refresh command refreshes said selected subset of a corresponding bank of each of a plurality of ranks.

11. The data processing system of claim 1, wherein said memory channel (130) comprises a plurality of ranks of double rate (DDR) version four (DDR4) memory.

12. A data processor comprising:

a memory accessing agent; and a memory controller coupled to said memory accessing agent and adapted to couple to a memory system, wherein said memory controller:

comprises a refresh logic circuit for generating refresh cycles to a memory of the memory system, having an on-the-fly mode wherein said on-the-fly mode comprises a first state and a second state, said first state corresponding to a first auto-refresh command that causes said memory to auto-refresh a bank, said second state corresponding to a second auto-refresh command that causes said memory to auto-refresh a selected subset of said bank;

switches between said first state and said second state in response to said refresh logic circuit detecting a first condition related to said bank of said memory system; and switches between said second state and said first state in response to refresh logic circuit detecting a second condition.

13. The data processor of claim 12, wherein said refresh logic circuit detects said first condition in response to a number of pending refreshes to said bank being above a predetermined threshold.

14. The data processor of claim 12, wherein said refresh logic circuit detects said second condition in response to a number of pending refreshes to said bank.

15. The data processor of claim 12, wherein:

said memory controller is adapted to refresh a first subset and a second subset of said bank within a refresh cycle time, when said second auto-refresh command is a refresh two (REF2) command; and each of said first subset and said second subset of said bank is a separate half subset of said bank.

16. The data processor of claim 12, wherein:

said memory controller is adapted to refresh a first subset, a second subset, a third subset, and a fourth subset of said bank within a refresh cycle time when said second auto-refresh command is a refresh four (REF4) command; and each of said first subset, said second subset, said third subset, and said fourth subset of said bank is a separate quarter subset of said bank.

17. The data processor of claim 12, wherein said memory controller detects said first condition in response to one or more of: a number of pending refreshes to said bank, a number of pending requests to said bank, a priority of said pending requests to said bank, and a type of said pending requests to said bank.

18. The data processor of claim 17, wherein said memory controller tracks said number of pending refreshes to said bank to determine an initiation of a switch between said first state and said second state.

19. The data processor of claim 12, wherein said second auto-refresh command refreshes said selected subset of said bank of one rank.

20. The data processor of claim 12, wherein said second auto-refresh command refreshes said selected subset of a plurality of banks of one rank.

21. The data processor of claim 12, wherein said second auto-refresh command refreshes said selected subset of a corresponding bank of each of a plurality of ranks.

22. A method for managing refresh of a memory in a memory system via a memory controller, the method comprising:

generating a first auto-refresh command when the memory controller is in a first state, wherein said first auto-refresh command causes the memory to auto-refresh a bank, generating a second auto-refresh command when the memory controller is in a second state, wherein said second auto-refresh command causes the memory to auto-refresh a selected subset of said bank, switching between said first state and said second state in response to the memory controller detecting a first condition related to said bank; and switching between said second state and said first state in response to the memory controller detecting a second condition.

23. The method of claim 22, wherein said detecting said first condition comprises:
   detecting when a number of pending refreshes to said bank are above a predetermined threshold.

24. The method of claim 22, wherein said detecting said second condition comprises:
   detecting that a number of refreshes sent corresponds to a total number of subsets of said bank; and
   detecting that the memory controller stores no access request to said bank.

25. The method of claim 22, wherein generating said second auto-refresh command comprises:
   refreshing a first subset and a second subset of said bank within a refresh period when said second auto-refresh command is a refresh two (REF2) command, wherein each of said first subset and said second subset of said bank is a separate half subset of said bank.

26. The method of claim 22, wherein generating said second auto-refresh command comprises:
   refreshing a first subset, a second subset, a third subset, and a fourth subset of said bank within a refresh period when said second auto-refresh command is a refresh two (REF2) command, wherein said first subset, said second subset, said third subset, and said fourth subset of said bank is a separate quarter subset of said bank.

27. The method of claim 22, further comprising:
   detecting said first condition in response to one or more of: a number of pending refreshes to said bank, a number of pending requests to said bank, a priority of said pending requests to said bank, and a type of said pending requests to said bank.

28. The method of claim 22, further comprising refreshing said selected subset of said bank of one rank in response to said generating said second auto-refresh command.

29. The method of claim 22, further comprising refreshing said selected subset of a plurality of banks of one rank in response to said generating said second auto-refresh command.

30. The method of claim 22, further comprising refreshing said selected subset of a corresponding bank of each of a plurality of ranks in response to said generating said second auto-refresh command.

31. The method of claim 22, further comprising:
   performing said generating said first auto-refresh command, said generating said second auto-refresh command, said switching between said first state and said second state, and said switching between said second state and said first state independently for each of a plurality of banks of the memory.

* * * * *